PROCESS FOR DIFFUSION OF CONTOURED JUNCTION

Filed May 12, 1966

INVENTOR.
HAROLD WEINSTEIN

BY

OSTROLENK, FABER, GERB & SOFFEN

ATTORNEYS 3,396,456

PROCESS FOR DIFFUSION OF CONTOURED JUNCTION

Harold Weinstein, Van Nuys, Calif., assignor to International Rectifier Corporation, El Segundo, Calif., a corporation of California Filed May 12, 1966, Ser. No. 549,723
4 Claims. (Cl. 29—580)

This invention relates to semiconductor devices, and more particularly relates to a novel method for the formation of a junction in a water of semiconductor material which junction has a predetermined contour.

The formation of junctions in semiconductor wafers by diffusion techniques are well known in the art. It is frequently desirable to form the junction in a wafer with some particular contour so that a subsequent lapping operation of one of the surfaces can selectively expose different conductivity type materials at the wafer surface by lapping or polishing below an uppermost region of the contoured surface. Electrodes can then be selectively applied to these exposed regions, thereby to define some particular type of semiconductor device.

In the formation of such arrangements, different methods have been used to accomplish the desired junction contour such as the use of selective masking techniques with a plurality of diffusion cycles, whereupon a given type of impurity material can be diffused deeper into the surface of a wafer from unmasked portions of the wafer surface.

The present invention is based on the characteristic that a relatively roughened wafer surface will permit a deeper penetration of impurity atoms during a diffusion cycle than will a polished wafer surface due to higher impurity density at the surface and surface crystal damage.

Accordingly, in accordance with the invention, the depth of penetration of a particular impurity element can be controlled by controlling the roughness of the wafer surface, whereupon a variable diffusion depth having a predetermined contour can be obtained by the diffusing atoms moving through the controlled roughness surface of the wafer. Once this predetermined countour is established, it is now possible to suitably remove material from the wafer surface in order to expose only the higher portions of the contoured junction, whereupon different conductivity types may be exposed at the wafer surface to receive electrodes.

Accordingly, a primary object of this invention is to provide a novel method of manufacture for a semiconductor device having one or more junctions therein.

Another object of this invention is to provide a novel method for diffusing impurity materials into a semiconductor wafer with different depths of penetration over the wafer area, thereby to form a predetermined contour for the depth of penetration of the impurity elements.

Yet another object of this invention is to provide a novel method of manufacture for semiconductor wafers which are to have diversely shaped junction contours therein.

These and other objects of this invention will become apparent from the following description when taken in connection with the drawings, in which.

Figure 1:
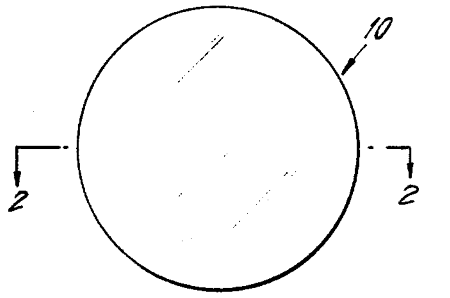
FIGURE 1 is a top view of a typical wafer which can be used as the starting wafer in accordance with the invention.

Referring first to FIGURE 1, I have illustrated therein a wafer 10 of semiconductor material which could have the N-type conductivity.

The following description and figures illustrate the manner in which the novel method of the invention can be employed to form a transistor-type device. It will, of course, be apparent that the method of the invention can be adapted for the formation of any device employing contoured or shaped junctions, and could be employed on a starting material of the P-type as well as the N-type. Moreover, it will be apparent that the process of the invention can be used in conjunction with diverse types of masking techniques.

Figure 3:
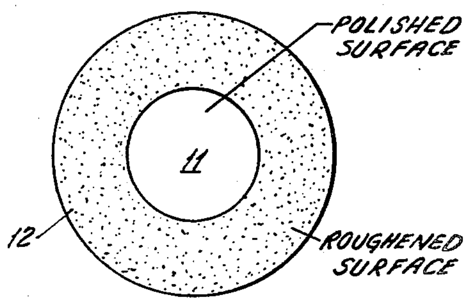
FIGURE 3 is a view similar to that of FIGURE 1 after a central portion of the wafer has been polished while the outer annular disc-shaped area surrounding the central surface portion of the wafer has been roughened.
Figure 2:
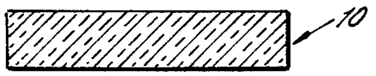
FIGURE 2 is a cross-sectional view of FIGURE 1 taken across the line 2—2 in FIGURE 1.

In accordance with the invention, and as shown in FIGURE 3, the upper surface of wafer 10 is first polished in any desired manner, and the outer area is thereafter roughened, thereby to define a central polished surface area 11 and an outer disc-shaped area 12 which is roughened. The initial polishing of the wafer can be accomplished as follows:

The outer surface 12 may be roughened as by sandblasting with a 600 grit and for .1 minute. Lapping or grinding may also be used as a method of roughing. Aluminum oxide, silicon carbide or other grit may be used.

It will, of course, be apparent that the areas selectively roughened and polished can be chosen in any desired manner, depending upon the particular configuration of the contour of the junction to be diffused into the upper wafer surface.

Figure 4:
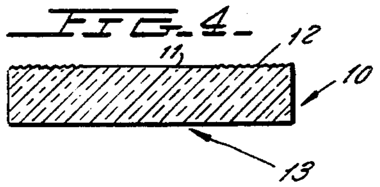
FIGURE 4 is a cross-sectional view of FIGURE 3 and illustrates in cross-section the roughened surface as contrasted to the polished surface in FIGURE 3.

The wafer of FIGURE 3, after the selective polishing and roughening, will have the cross-section shown in FIGURE 4 where the bottom surface 13 can be polished to the same degree as upper surface portion 11, although the polishing of the full lower surface 13 will depend only on the depth of penetration desired of the diffusing atoms into the bottom surface.

Figure 5:
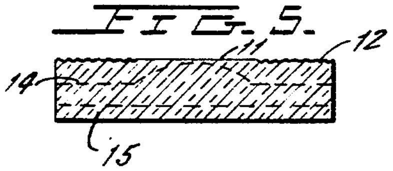
FIGURE 5 is similar to FIGURE 3 and illustrates the contour of a junction diffused into the upper surface of the wafer of FIGURE 4.

Thereafter, and as illustrated in FIGURE 5, the wafer of FIGURE 4 is placed in a suitable diffusion furnace which could incorporate boron anhydride as a diffusing medium. The wafer is then exposed to the flow of vaporized boron anhydride for 120 minutes at a temperature of 1250° C., whereupon the upper end lower surfaces of wafer 10 are converted to the P-type conductivity and define two junction 14 and 15 with the central N-type body of the wafer.

The lower junction 15 will extend straight across the wafer since the diffusing atoms will all diffuse to approximately the same depth from the bottom surface of the wafer.

In accordance with the invention, however, the junction 14 will have a contour dependent upon the degree of roughening of the upper surface. Thus, the junction 14 will have a greater depth at its outer regions than at its central regions, since the diffusing atoms will move through surface 12 to a greater depth than through the polished surface 11.

This contouring of the upper junction 14 then makes it possible to expose the central N-type material at the upper surface by a simple lapping operation of the upper surface.

More particularly, the junction 14 will be approximately 1 mil from the upper surface of the central regions thereof and 1.5 mils from the upper surface at its outer region. Thereafter, a lapping or other suitable polishing operation applied to the upper surface which will remove 1.1 mils of material from the upper surface, as illustrated in FIGURE 6, will expose an N-type surface region 20 at the upper surface of the wafer and a P-type annular surface region 21 which surrounds region 20.

Figure 6:
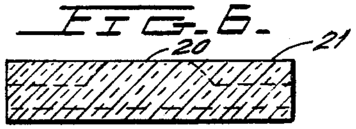
FIGURE 6 illustrates the wafer of FIGURE 5 after the upper surface thereof has been lapped to expose two different conductivity type areas at the upper surface of the wafer.
Figure 7:
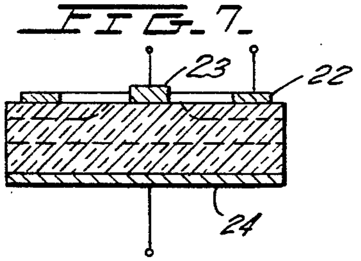
FIGURE 7 illustrates the device of FIGURE 6 after the connection of electrode means thereto to form a transistor type device.

It is now possible to apply an annular electrode 22 to region 21, as illustrated in FIGURE 7, and a central electrode 23 to the central N-type region 20 of FIGURE 6, as shown in FIGURE 7. A common bottom electrode 24 is then connected to the bottom surface of the wafer which is of the P-type.

The resulting device is a transistor type device where electrode 24 serves as the base electrode; electrode 22 serves as the collector electrode; while the electrode 23 serves as the emitter electrode of the transistor.

It will become readily apparent to those skilled in the art that any type of contour can be applied to junction 14, whereupon different conductivity regions having preselected shapes will be exposed at the wafer surface after the lapping operation, illustrated in FIGURE 6.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A process for the manufacture of a semiconductor device having diverse conductivity types exposed at one surface of a semiconductor wafer; said process comprising the steps of polishing selective regions of the upper surface of a semiconductor wafer such that regions other than said selected regions are rougher than said selected surface regions, and thereafter diffusing impurity elements associated with one of the conductivity types over the entire exposed area of said upper surface of said semiconductor wafer, whereupon said diffusing elements will diffuse to preselected depths depending upon the degree of roughness of said surface area of said upper surface of said semiconductor wafer to form a junction below said upper surface which has a predetermined contour.

2. The process of claim 1 wherein said predetermined contour includes a contour wherein said junction is closer to said upper surface of said wafer at regions adjacent said polished areas than at said roughened areas of said upper surface.

3. The process as set forth in claim 1 which includes the subsequent step of removing a predetermined thickness from said upper surface of said wafer until at least the uppermost portion of said contoured junction is exposed at the upper surface of said wafer.

4. The process as set forth in claim 3 which includes the further steps of applying electrodes to the diverse conductivity type surface regions of said upper surface of said wafer.

References Cited

UNITED STATES PATENTS 3,009,841 6/1959 Faust ------------ 148—187 X

WILLIAM I. BROOKS, *Primary Examiner.*